(12) United States Patent
Okubo et al.

(10) Patent No.: US 10,872,799 B2
(45) Date of Patent: Dec. 22, 2020

(54) LOAD PORT AND METHOD FOR CARRYING WAFERS

(71) Applicant: SHIN-ETSU HANDOTAI CO., LTD., Tokyo (JP)

(72) Inventors: Yuji Okubo, Nishigo-mura (JP); Seiji Satoh, Annaka (JP); Toshihiro Suzuki, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/321,669

(22) PCT Filed: Apr. 24, 2017

(86) PCT No.: PCT/JP2017/016127
§ 371 (c)(1),
(2) Date: Jan. 29, 2019

(87) PCT Pub. No.: WO2018/029915
PCT Pub. Date: Feb. 15, 2018

(65) Prior Publication Data
US 2020/0185246 A1 Jun. 11, 2020

(30) Foreign Application Priority Data
Aug. 8, 2016 (JP) .................................. 2016-155895

(51) Int. Cl.
*H01L 21/67* (2006.01)
*H01L 21/677* (2006.01)

(52) U.S. Cl.
CPC .. *H01L 21/67772* (2013.01); *H01L 21/67126* (2013.01); *H01L 21/67742* (2013.01)

(58) Field of Classification Search
CPC combination set(s) only.
See application file for complete search history.

(56) References Cited

U.S. PATENT DOCUMENTS 6,358,128 B1 * 3/2002 Sakurai ................. B24B 37/042
257/E21.23
2003/0031537 A1 2/2003 Tokunaga
(Continued)

FOREIGN PATENT DOCUMENTS

JP 2000-150613 A 5/2000
JP 2002-359273 A 12/2002
(Continued)

OTHER PUBLICATIONS

Jul. 4, 2017 International Search Report issued in International Patent Application No. PCT/JP2017/016127.
(Continued)

*Primary Examiner* — Moin M Rahman
(74) *Attorney, Agent, or Firm* — Oliff PLC

(57) ABSTRACT

A load port including: a tabular portion which constitutes a part of a wall surface of a wafer carrying chamber and has an opening through which the wafer carrying chamber is opened; a mounting table on which a wafer storage container is mounted; a door section which can open and close the opening; a sucking tool which can suck and hold a lid; a latch which can fix and unfix a container main body and lid; and a latch driving mechanism storage section which stores a latch driving mechanism therein, load port being configured to enable setting an air pressure in latch driving mechanism storage section to be equal to the air pressure in a clean room or lower than the air pressure in clean room. Consequently, it is possible to provide the load port and a method for carrying wafers which can prevent dust from adhering to the wafers.

6 Claims, 8 Drawing Sheets

(56) References Cited

U.S. PATENT DOCUMENTS

| | | | |
|---|---|---|---|
| 2004/0055650 | A1 | 3/2004 | Inoue et al. |
| 2008/0069670 | A1* | 3/2008 | Hashimoto ....... H01L 21/67772 414/219 |
| 2011/0318143 | A1* | 12/2011 | Isomura ............ H01L 21/67161 414/217.1 |
| 2015/0221538 | A1 | 8/2015 | Ochiai et al. |
| 2017/0004985 | A1 | 1/2017 | Nishi et al. |

FOREIGN PATENT DOCUMENTS

| | | |
|---|---|---|
| JP | 2003-045933 A | 2/2003 |
| JP | 2009-252780 A | 10/2009 |
| JP | 2015-146347 A | 8/2015 |
| WO | 2015/098892 A1 | 7/2015 |

OTHER PUBLICATIONS

Feb. 21, 2019 International Preliminary Report on Patentability issued in International Patent Application No. PCT/JP2017/016127.
Mar. 11, 2020 Extended Search Report issued in European Patent Application No. 17838991.2.
Aug. 5, 2020 Office Action issued in Taiwanese Patent Application No. 106113907.

* cited by examiner

[FIG. 1]
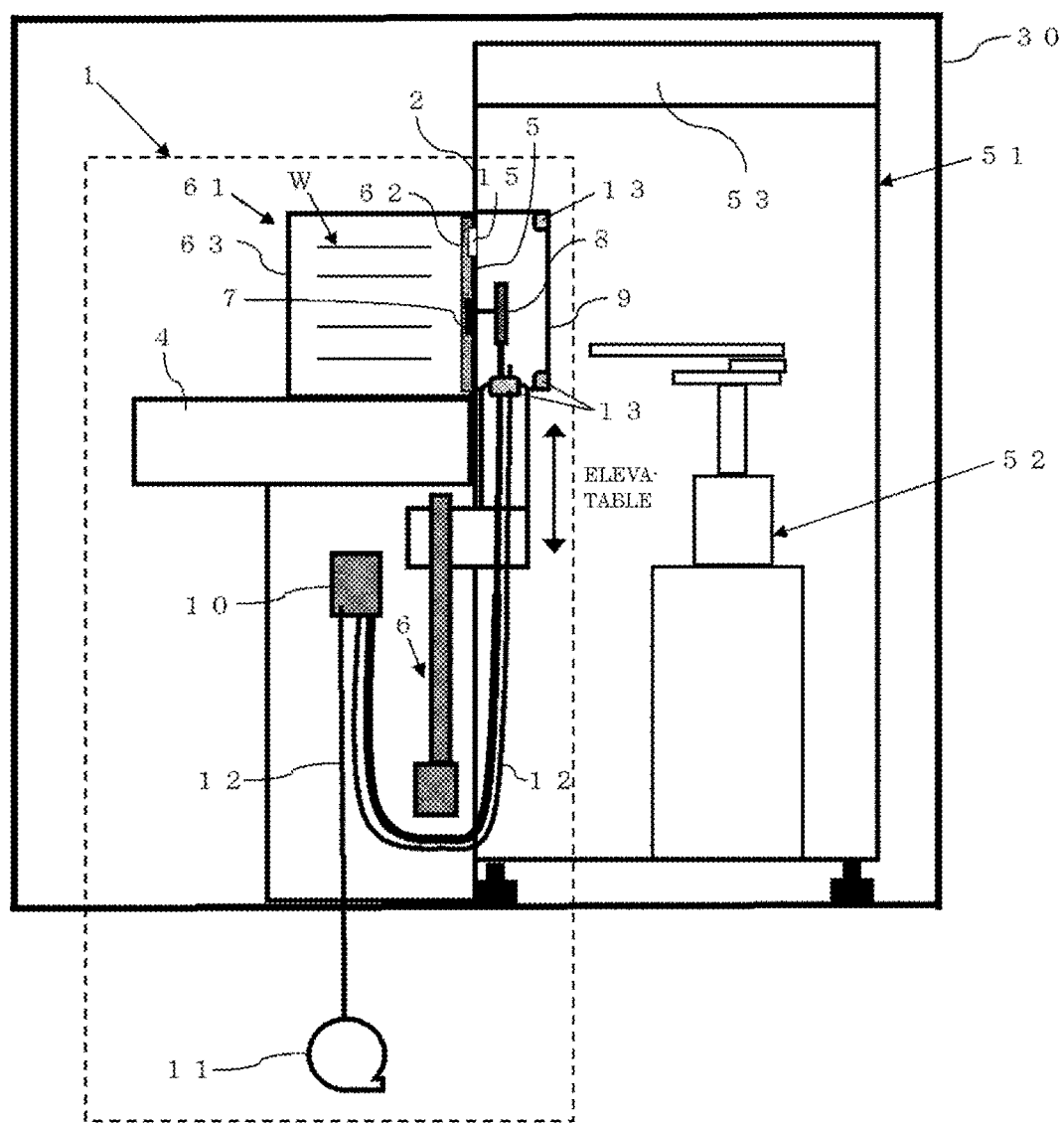

[FIG. 2]
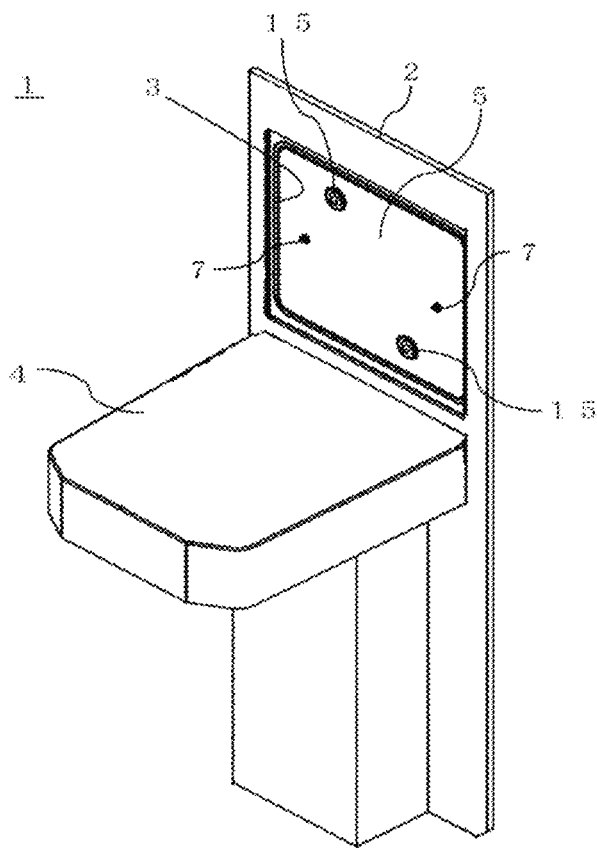
[FIG. 3]
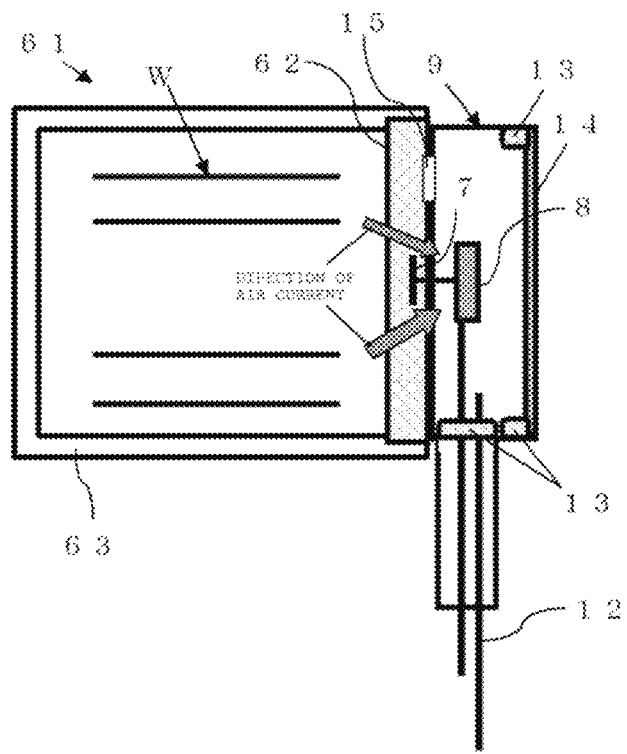

[FIG. 4]
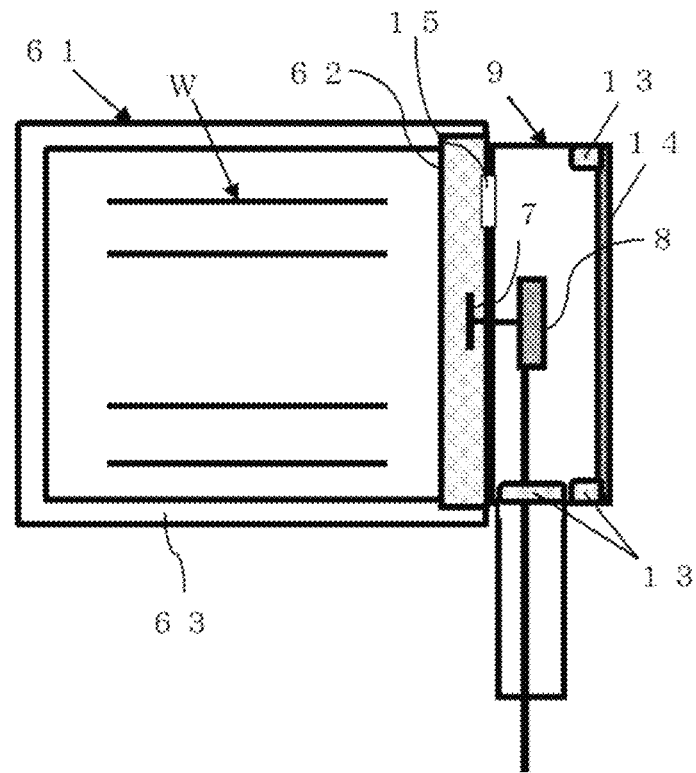
[FIG. 5]
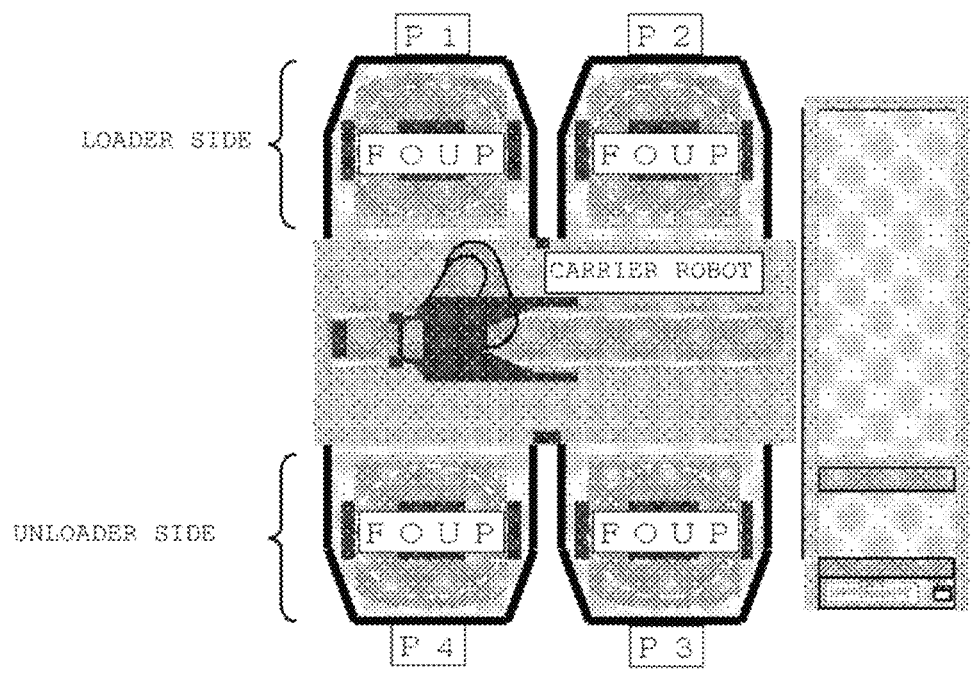

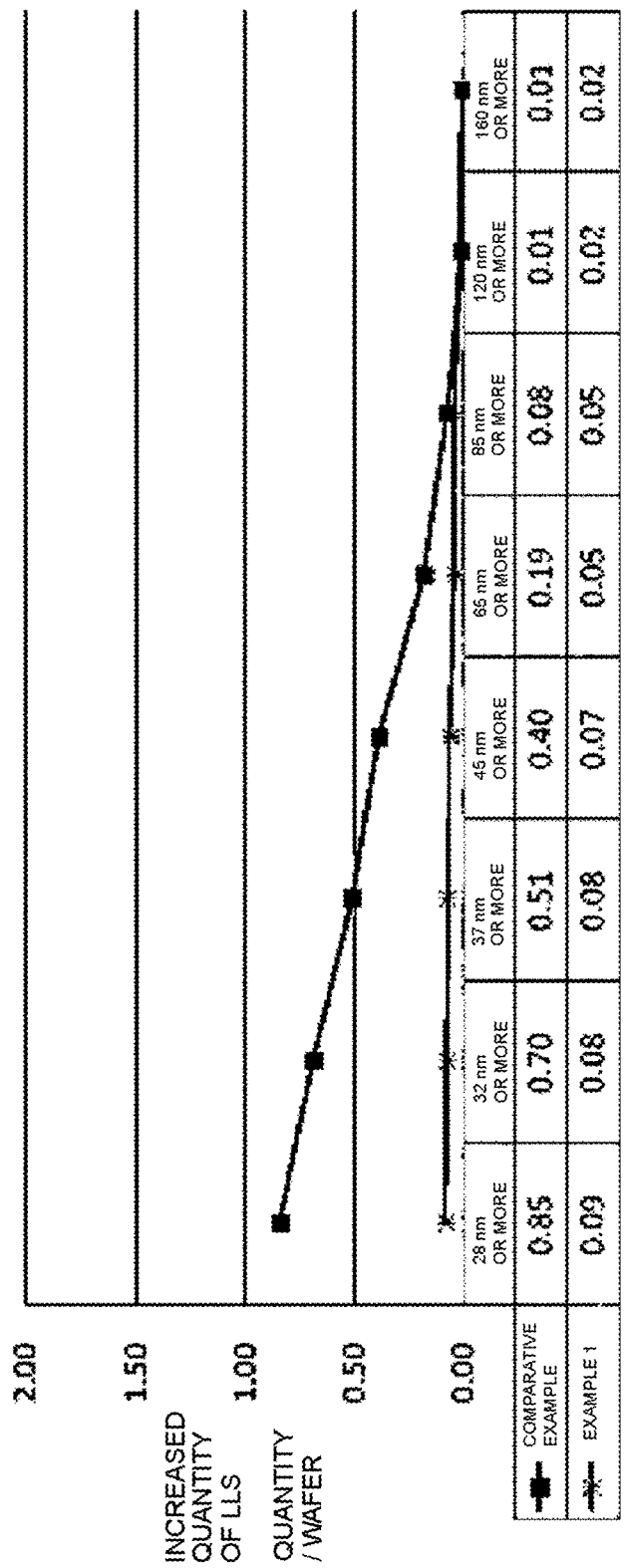
[FIG. 6]

[FIG. 7]
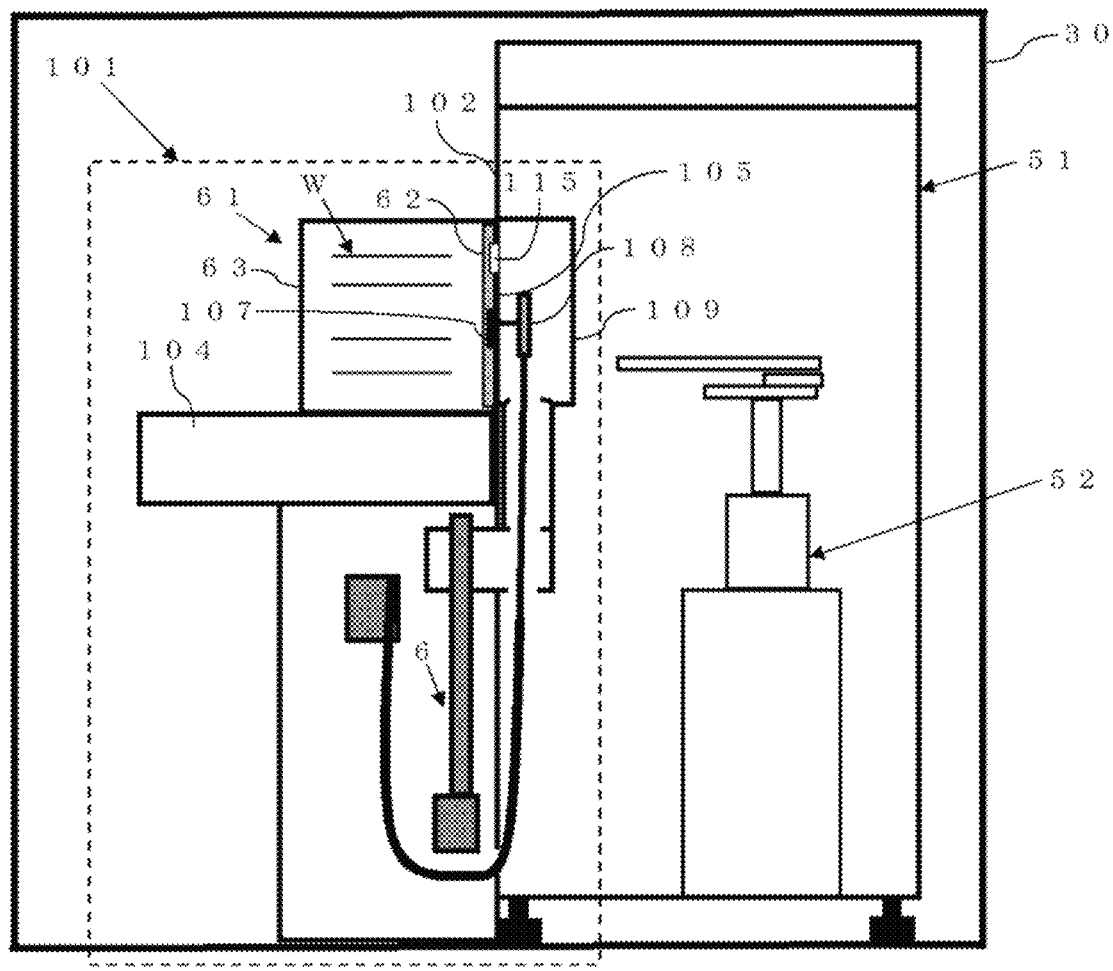

[FIG. 8]
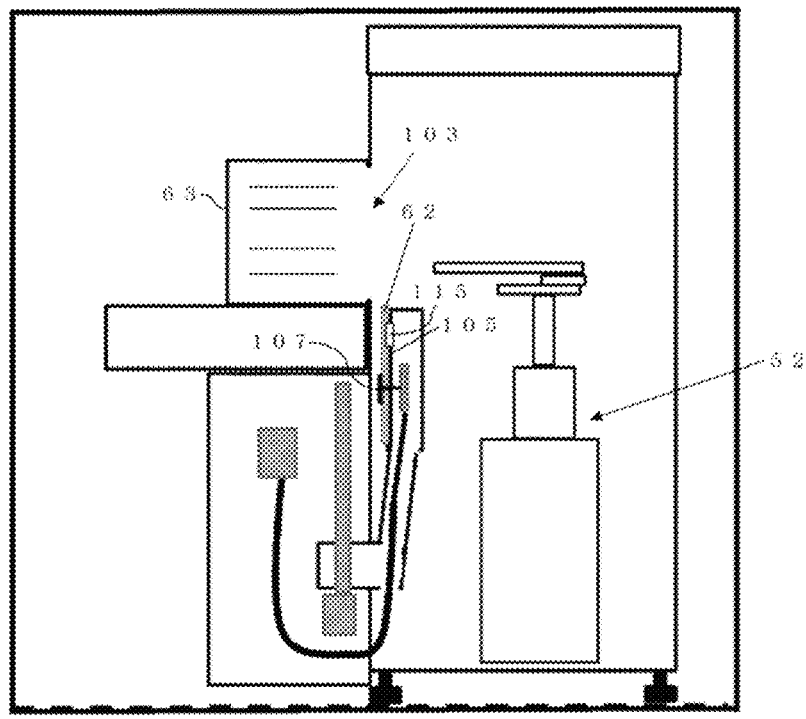
[FIG. 9]
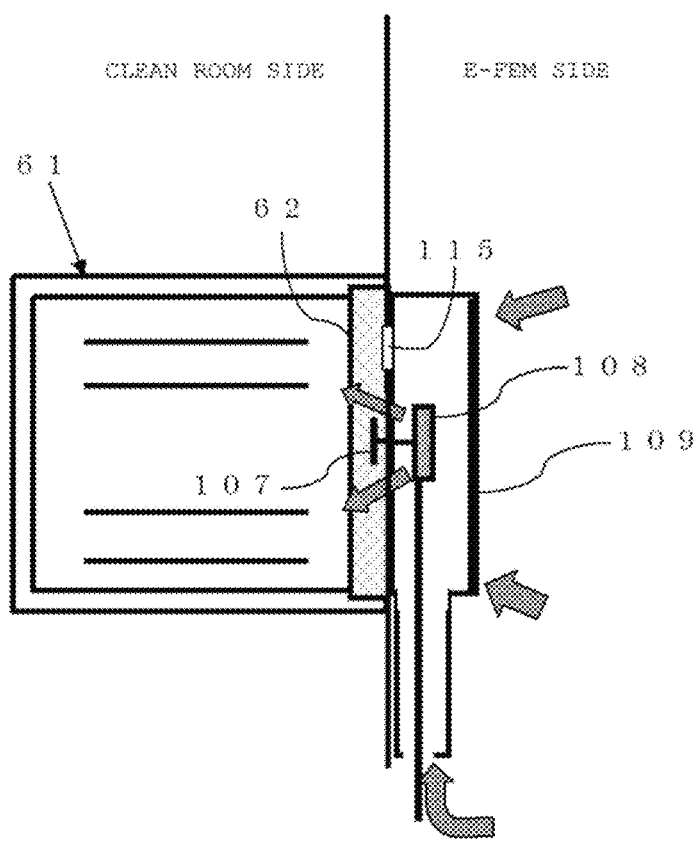

[FIG. 10]
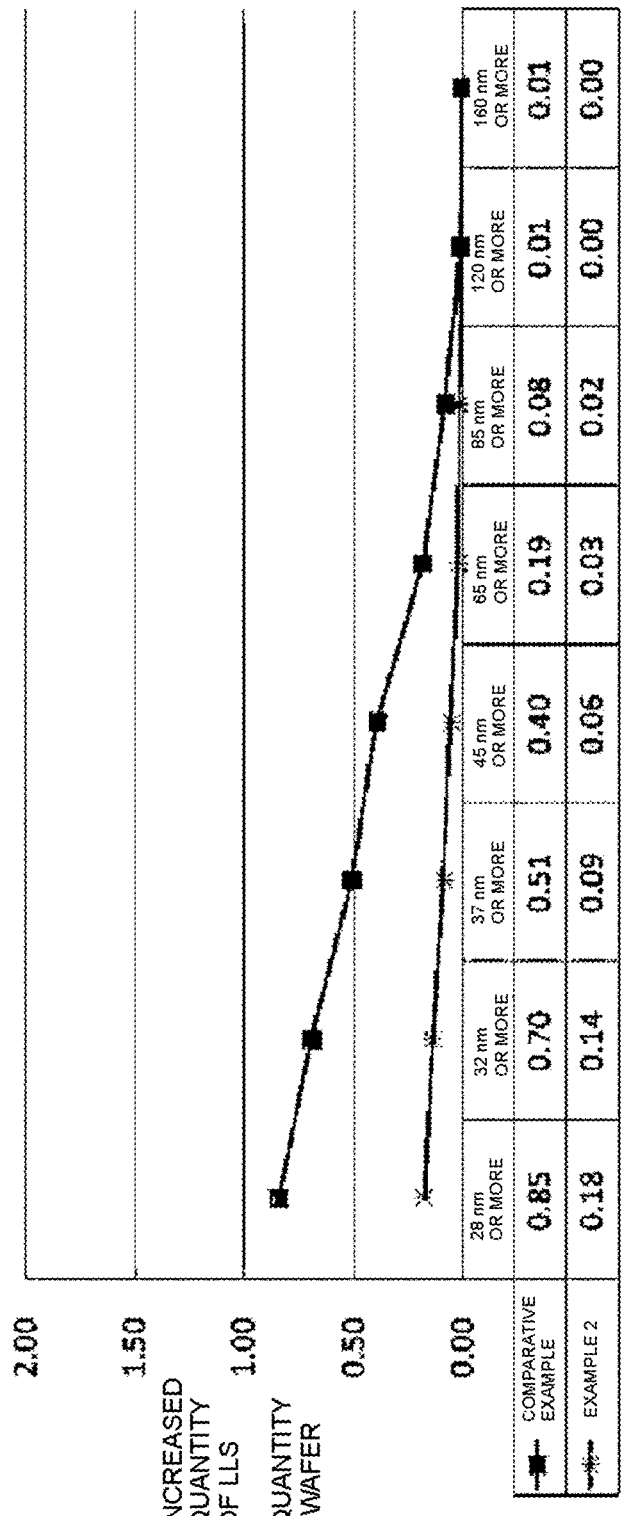

[FIG. 11]
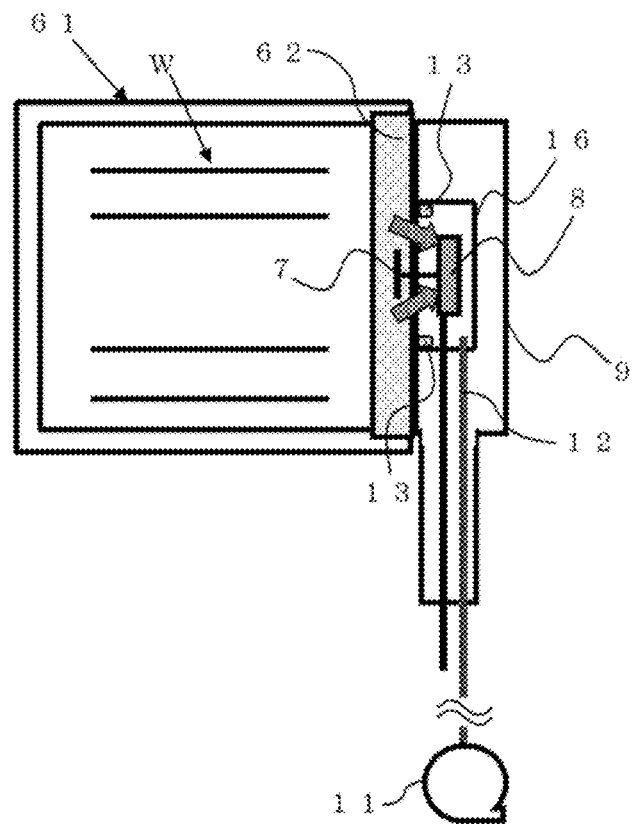
[FIG. 12]
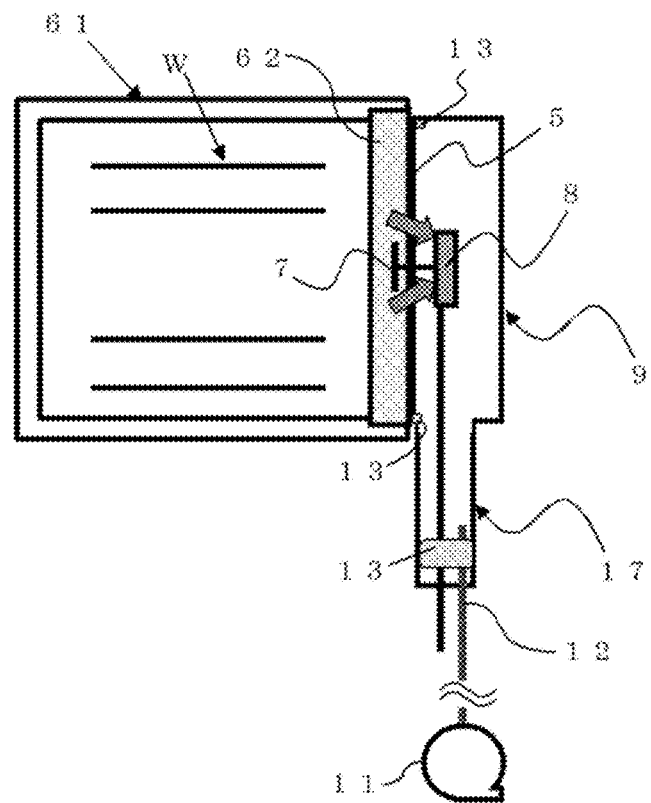

LOAD PORT AND METHOD FOR CARRYING WAFERS

TECHNICAL FIELD

The present invention relates to a load port and a method for carrying wafers.

BACKGROUND ART

Wafers such as silicon wafers are carried and stored in a wafer storage container called an FOUP (Front-Opening Unified Pod) or an FOSB (Front Open Shipping BOX). For example, to process and transfer the wafers, each wafer is taken out from the wafer storage container through a unit called an E-FEM (Equipment Front End Module) incorporated in an apparatus. Further, a lid of the wafer storage container is sucked and held by suckers provided on a door section of a load port of the E-FEM, and a latch bar incorporated in the lid is operated by a latch to open and close the lid.

Referring to FIGS. 7 and 8, a conventional load port 101 will be more specifically described. Usually, the load port 101 is installed on a wall surface of a wafer carrying chamber 51 such as E-FEM installed in a clean room 30. This load port is constituted of a mounting table 104 on which a wafer storage container 61 including a container main body 63 and a lid 62 is mounted, a tabular portion 102 having an opening through which the inside of the wafer carrying chamber 51 is opened, and others, and a door section 105 fitted in the opening can be driven to be detached from the opening, whereby the opening can be opened and closed.

Further, as shown in FIG. 7, the door section 105 includes a sucking tool 115 which can hold the lid 62 by sucking the lid 62. Furthermore, the door section 105 includes a latch 107. The latch 107 can be driven to unfix the container main body 63 and the lid 62 and also driven to fix the container main body 63 and the lid 62. Moreover, as shown in FIG. 8, in a state where the lid 62 is sucked and held by the sucking tool 115, when the latch 107 unfixes the container main body 63 and the lid 62 to detach the door section 105 from the opening 103, the lid 62 can be detached from the wafer storage container 61.

Additionally, in this manner, the inside of the wafer storage container 61 is spatially coupled with the inside of the wafer carrying chamber 51, and then each wafer is taken in and out by a wafer carrier robot 52.

CITATION LIST

Patent Literatures

Patent Literature 1: Japanese Unexamined Patent Publication (Kokai) No. 2015-146347
Patent Literature 2: Japanese Unexamined Patent Publication (Kokai) No. 2002-359273

SUMMARY OF INVENTION

Technical Problem

One of technical problems concerning the load port and the E-FEM is to prevent particles from entering the wafer storage container or the wafer carrying chamber (see Patent Literatures 1 and 2). Patent Literature 2 discloses the technology concerning an opener (~load port) which automatically opens and closes a lid of the FOUP and the E-FEM, and describes that an operation to open the lid of the FOUP causes turbulence of an air current which becomes a factor of dust generation and may possibly contaminate each wafer accommodated in the FOUP. In particular, the paragraph (0006) in Patent Literature 2 has the description "a door 101 opened by an opener 200 is moved up and down in the box B as will be described later, but dust generation is caused depending on a driving source used for this operation to move up/down", and describes that dust generated from the driving source or the like becomes a problem.

Usually, an air pressure in the E-FEM is higher than the air pressure in a clean room to keep the cleanliness inside. The air in the E-FEM is discharged into the clean room from a gap of a latch through a space (a latch driving mechanism storage section 109) where a driving system component (a latch driving mechanism 108) to drive the latch 107 of the load port is stored. On the other hand, at the time of opening and closing the lid 62 of the wafer storage container 61, dust is generated from the latch driving mechanism 108 of the latch 107 of the load port 101.

Usually, the latch driving mechanism storage section 109 storing the latch driving mechanism 108 is placed in the E-FEM, and an air pressure in this space is higher than that of the clean room. That is because the inside of the latch driving mechanism storage section 109 is spatially connected with the inside of the E-FEM through a gap of a lid section or a wiring hole of the latch driving mechanism storage section 109. Thus, the generated dust moves from the gap of the latch into the wafer storage container with the air current flowing toward the clean room, and adheres to each wafer (see FIG. 9).

Further, there are parts which can move at the time of opening/closing in the lid 62 of the wafer storage case 61, and dust generated here also moves into the wafer storage container 61 with the air current and adheres to each wafer W. In this manner, there is the problem that the dust generated from the load port, movable portions in the lid of the wafer storage container, and the like adheres to wafers.

In view of the above-described problems, it is an object of the present invention to provide a load port and a method for carrying wafers which can prevent dust generated from the load port, movable portions in a lid of a wafer storage container, and the like at the time of taking in and out wafers to and from the wafer storage container from adhering to the wafers.

Solution to Problem

To achieve the object, the present invention provides a load port which is provided to be adjacent to a wafer carrying chamber installed in a clean room and configured to take in and out wafers between the wafer carrying chamber and a wafer storage container comprising a container main body and a lid, the load port comprising:
  a tabular portion which constitutes a part of a wall surface of the wafer carrying chamber and comprises an opening through which the wafer carrying chamber is opened;
  a mounting table on which the wafer storage container is mounted in such a manner that the lid of the wafer storage container faces the opening;
  a door section which is fitted in the opening, and drivable in such a manner that the door section is detached from the opening to enable opening and closing of the opening;

a sucking tool which is installed in the door section, and capable of holding the lid by sucking the lid;

a latch which is installed in the door section, drivable to unfix the container main body and the lid, and drivable to fix the container main body and the lid; and a latch driving mechanism storage section which is provided to be adjacent to the door section in the wafer carrying chamber, and stores a latch driving mechanism to drive the latch therein, wherein opening/closing the lid is enabled by unfixing the container main body and the lid by the latch and relatively moving the container main body to the sucking tool in a state where the lid is sucked and held by the sucking tool, and an air pressure in the latch driving mechanism storage section is settable to be equal to an air pressure in the clean room or lower than the air pressure in the clean room.

When the load port which can set an air pressure in the latch driving mechanism storage section to be equal to or lower than the air pressure in the clean room is adopted, an air current flowing from the latch driving mechanism storage section to the clean room is hardly produced, dust generated from the load port or the movable portions or the like in the lid of the wafer storage container hardly moves to the wafer storage container, and hence an amount of particles adhering to the wafers can be reduced.

At this time, it is preferable that the latch driving mechanism storage section is connected to an exhaust device, and the exhaust device enables reducing the air pressure in the latch driving mechanism storage section to be lower than the air pressure in the clean room.

In this manner, the exhaust device can reduce the air pressure in the latch driving mechanism storage section to be lower than the air pressure in the clean room.

Further, it is preferable that the latch driving mechanism storage section is made airtight by a seal material and sealed to the wafer carrying chamber.

Such a structure can prevent the inflow of the air from the wafer carrying chamber by using the seal material, and can set the air pressure in the latch driving mechanism storage section to be equal to or lower than the air pressure in the clean room.

Furthermore, it is preferable that the load port according to the present invention further includes an inner cap which stores the latch driving mechanism therein in the latch driving mechanism storage section, wherein the inner cap is connected to the exhaust device, and the exhaust device enables reducing an air pressure in the inner cap to be lower than the air pressure in the clean room.

When the inner cap is further installed in the latch driving mechanism storage section, an exhaust capacity can be reduced, and an exhaust volume can be decreased. Moreover, in case of sealing the inner cap, a sealing shape can be simplified, a sealing area can be reduced, thus the sealability can be more enhanced, and a machine difference can be decreased due to simple construction. Additionally, a reduction in exhaust volume can lead to miniaturization of exhaust facilities and a decrease in facility cost and running cost.

Further, it is preferable that the load port according to the present invention further includes a hollow shaft section which supports the latch driving mechanism storage section, wherein an inner space of the shaft section is connected to an inner space of the latch driving mechanism storage section, and the inside of the shaft section and the inside of the latch driving mechanism storage section are made airtight by the seal material and sealed to the wafer carrying chamber, and the exhaust device connected to the shaft section enables reducing the air pressure in the latch driving mechanism to be lower than the air pressure in the clean room by decreasing an air pressure in the shaft section.

In this manner, since the exhaust piping can be thickened by connecting the exhaust device to the shaft section, the exhaust volume can be further increased. Thus, the dust becomes more difficult to move into the wafer storage container, and hence the amount of particles adhering to the wafers can be further reduced. Furthermore, since the part which uses a large amount of seal material can be kept away from the wafers, thus suppressing contamination from the seal material.

Furthermore, to achieve the object, the present invention provides a method for carrying wafers by which wafers are taken in and out between a wafer carrying chamber and a wafer storage container with the use of the above load port which is provided to be adjacent to the wafer carrying chamber installed in a clean room, the method comprising:

setting an air pressure in the latch driving mechanism storage section to be equal to the air pressure in the clean room or lower than the air pressure in the clean room; and unfixing the container main body and the lid by the latch and relatively moving the container main body to the sucking tool in a state where the lid is sucked and held by the sucking tool to open the lid, coupling an inner space of the wafer carrying chamber with an inner space of the wafer storage container by detaching the door section from the opening to open the opening, and then taking in and out the wafers between the wafer carrying chamber and the wafer storage container.

As described above, according to the method for carrying wafers which uses the load port of the present invention, it is possible to reduce an amount of particles adhering to the wafers at the time of carrying them.

Moreover, it is possible that the air pressure in the wafer carrying chamber is set to be higher than the air pressure in the clean room.

Consequently, the inflow of the air from the clean room to the wafer carrying chamber can be suppressed, and the cleanliness of the wafer carrying chamber can be maintained.

Advantageous Effects of the Invention

According to the load port and the method for carrying wafers of the present invention, it is possible to prevent dust, which has been produced from the load port and movable portions in the lid of the wafer storage container or the like at the time of taking in or out each wafer to or from the wafer storage container, from adhering to each wafer.

BRIEF DESCRIPTION OF DRAWINGS

FIG. 1 is a schematic view showing an example of a load port according to the present invention;

FIG. 2 is a perspective view showing an example of the load port according to the present invention;

FIG. 3 is a schematic view showing an example of a latch driving mechanism storage section of the load port according to the present invention;

FIG. 4 is a schematic view showing another example of the latch driving mechanism storage section of the load port according to the present invention;

FIG. 5 is a schematic view of a transfer machine used in each of Examples 1 and 2 and Comparative Example;

FIG. 6 is a graph showing each increased quantity of LLS per wafer in the single carriage measured in each of Example 1 and Comparative Example;

FIG. 7 is a schematic view showing a state where an opening of a conventional load port is closed;

FIG. 8 is a schematic view showing a state where the opening of the conventional load port is opened;

FIG. 9 is a schematic view of a latch driving mechanism storage section in the conventional load port;

FIG. 10 is a graph showing each increased quantity of LLS per wafer in the single carriage measured in each of Example 2 and Comparative Example;

FIG. 11 is a schematic view showing an example of an embodiment where an inner cap is installed in a latch driving mechanism storage section of a load port according to the present invention; and FIG. 12 is a schematic view showing an example of an embodiment where an exhaust device is connected to a shaft section of the load port according to the present invention.

DESCRIPTION OF EMBODIMENTS

An embodiment of the present invention will now be described hereinafter in detail, but the present invention is not restricted thereto.

First, a load port according to the present invention will be described with reference to FIGS. 1 to 4, 11, and 12. It is to be noted that same reference numerals denote same elements shown in the respective drawings to appropriately omit a description thereof. As shown in FIG. 1, a load port 1 according to the present invention is provided to be adjacent to a wafer carrying chamber 51 installed in a clean room 30, and it is used at the time of taking in and out each wafer W between the wafer carrying chamber 51 and a wafer storage container 61. As the wafer carrying chamber 51, for example, an E-FEM can be adopted. It is to be noted that the E-FEM is a module constituted of, e.g., the load port 1, a wafer carrier robot 52, an FFU (Fan Filter Unit) 53 configured to keep the wafer carrying chamber 51 clean, and others. Furthermore, as the wafer storage container 61, an FOUP can be used.

FIG. 2 is a perspective view showing the load port 1 alone. As shown in FIGS. 1 and 2, the load port 1 constitutes a part of a wall surface of the wafer carrying chamber 51, and includes a tabular portion 2 having an opening 3 through which the wafer carrying chamber 51 is opened and a mounting table 4 on which the wafer storage container 61 is mounted in such a manner that a lid 62 of the wafer storage container 61 faces the opening 3.

Furthermore, as shown in FIGS. 1 and 2, the load port 1 includes a door section 5 fitted in the opening 3. The door section 5 can be driven to be detached from the opening 3, whereby the opening 3 can be opened and closed. For example, the door section 5 can be configured to be movable upward and downward by a door section driving mechanism 6 as shown in FIG. 1. For instance, when the door section driving mechanism 6 uses a motor, a cylinder, or the like to drive up and down support components of the door section 5 connected to a guide, the door section 5 can be moved up and down. With the use of such a door section driving mechanism 6, the door section 5 can be moved up to be fitted in the opening 3 and, on the other hand, the door section 5 can be moved down to be detached from the opening 3.

Moreover, as shown in FIGS. 1 and 2, the load port 1 includes sucking tools 15 installed in the door section 5. When the sucking tools 15 suck the lid 62, they can hold the lid 62. As the sucking tools 15, specifically, sucking disks or the like which can vacuum-suck the lid 62 can be used.

Additionally, as shown in FIGS. 1 and 2, the load port 1 includes latches 7 installed in the door section 5. The latches 7 can be driven to unfix a container main body 63 and the lid 62, and also driven to fix the container main body 63 and the lid 62. Usually, the lid 62 of the wafer storage container 61 such as an FOUP is provided with a lock mechanism which can fix the container main body 63 and the lid 62. Engagement holes with which the latches 7 engage are provided in the lock mechanism, and rotation of the latches 7 in a state where the latches 7 engage with the engagement holes enables switching a fixed state and an unfixed state of the container main body 63 and the lid 62. The phrases "driven to unfix the container main body 63 and the lid 62" and "driven to fix the container main body 63 and the lid 62" in the present invention mean that the latches 7 are driven in such a manner that they engage with the engagement holes in the lock mechanism provided in the lid 62 and then driven to rotate in a predetermined rotating direction, for example.

Further, as shown in FIG. 1, the load port 1 is provided to be adjacent to the door section 5 in the wafer carrying chamber 51, and includes a latch driving mechanism storage section 9 storing a latch driving mechanism 8 which drives the latches 7. It is to be noted that movement of the latch driving mechanism 8 is controlled by a latch driving control section 10 so that the latches 7 can be driven.

Further, the load port 1 is configured to unfix the container main body 63 and the lid 62 with the use of the latches 7 and relatively move the container main body 63 to the sucking tools 15 in a state where the lid 62 is sucked and held by the sucking tools 15, thereby opening/closing the lid 62. Here, the phrase "relatively move the container main body 63 to the sucking tools 15" means that the sucking tools 15 may be moved or the container main body 63 may be moved.

According to such a structure, more specifically, in case of the load port 1 shown in FIG. 1, in a state where the lid 62 is sucked and held by the sucking tools 15, when the door section 5 is detached from the opening 3, the opening 3 can be opened and, at the same time, the lid 62 can be detached from the container main body 63.

Besides, it is possible to adopt a structure in which the mounting table 4 can move in a direction to separate from the opening 3 while having the container main body 63 of the wafer storage container 61 mounted thereon and the lid 62 can be detached from the container main body 63 by sucking and holding the lid 62 with the sucking tools 15 and then moving the mounting table 4 to separate from the opening 3.

Furthermore, the load port 1 according to the present invention is configured to enable setting an air pressure in the latch driving mechanism storage section 9 to be equal to the air pressure in the clean room 30 or lower than the air pressure in the clean room 30. With such a configuration, an air current flowing from the latch driving mechanism storage section 9 toward the clean room 30 is hardly produced, and hence dust generated from the latch driving mechanism 8 hardly reaches the wafer storage container 61. Moreover, in case of a low pressure in particular, since an air current is produced in a direction from the clean room 30 to the latch driving mechanism storage section 9, it becomes more difficult for the dust generated from the latch driving mechanism 8 to reach the wafer storage container 61. Additionally, since the latches 7 are coupled with the lid of the wafer storage container 61, the inside of the lid 61 can be set to a pressure which is equal to or lower than the air pressure in the clean room 30, and the dust generated from movable portions in the lid 62 hardly reaches the inside of the wafer storage container 61. Consequently, at the time of carriage, an amount of particles adhering to each wafer W can be reduced.

A more specific description will now be given on a configuration to reduce the air pressure in the latch driving mechanism storage section 9 to be lower than the air pressure in the clean room 30. As shown in FIG. 1, if the latch driving mechanism storage section 9 is connected to an exhaust device 11 (e.g., a pump or an ejector), the exhaust device 11 can reduce the air pressure in the latch driving mechanism storage section 9 to be lower than the air pressure in the clean room 30. With such a configuration, an air current in a direction from the latch driving mechanism storage section 9 to the clean room 30 is hardly produced, but an air current is produced in a direction from the clean room 30 to the latch driving mechanism storage section 9, the exhaust device 11 can suck and remove the dust generated by the latch driving mechanism 8 and the like, and an amount of particles adhering to the wafers W can be further reduced. It is to be noted that, to prevent the cleanliness of the clean room 30 from becoming poor due to exhaust from the exhaust device 11, installing the exhaust device 11 outside the clean room 30 is preferable. At this time, the exhaust device 11 may be connected to the inside of the latch driving mechanism storage section 9 through a vacuum line 12 as shown in FIG. 1.

Further, at this time, as shown in FIGS. 1 and 3, it is preferable to make the latch driving mechanism storage section 9 airtight by a seal material 13 and seal the same to the wafer carrying chamber 51. When the latch driving mechanism storage section 9 is closed to the wafer carrying chamber 51, it is possible to prevent the inflow of air from the wafer carrying chamber 51 having a higher air pressure, and the air pressure in the latch driving mechanism storage section 9 can be easily maintained lower. Consequently, the air current in the direction toward the wafer storage container 61 can be further suppressed, and adhesion of particles to the wafers can be further reduced.

In particular, as shown in FIG. 3, in the latch driving mechanism storage section 9, a gap can be readily formed between a lid section 14 which can be opened/closed for maintenance or the like and a main body of the latch driving mechanism storage section 9 or between an end portion of a hole through which a cable to transmit electric power or a control signal to the latch driving mechanism 8 is inserted into the latch driving mechanism storage section 9 and the cable. Furthermore, in case of connecting the vacuum line 12 in the latch driving mechanism storage section 9, a gap is likewise readily formed. Thus, as shown in FIGS. 1 and 3, using the seal material 13 to fill such a gap enables effectively closing the latch driving mechanism storage section 9 from the wafer carrying chamber 51.

Moreover, as shown in FIG. 11, it is preferable for the load port 1 to have an inner cap 16 which stores the latch driving mechanism 8 therein in the latch driving mechanism storage section 9, and also preferable for the inner cap 16 to be connected to the exhaust device 11 so that an air pressure in the inner cap 16 can be reduced to be lower than the air pressure in the clean room 30 by the exhaust device 11. It is to be noted that the clean room 30 is not shown in FIG. 11, but this configuration is basically the same as that shown in FIG. 1. Additionally, the inner cap 16 may be sealed with the seal material 13.

In general, the structure of the latch driving mechanism 8 differs depending on each manufacturer. When the structure is simple and the latch driving mechanism storage section 9 has an extra inner space, installing the inner cap 16 is effective. The installation of the inner cap 16 can result in a reduction in an exhaust capacity and an exhaust volume. Further, since a shape which is to be sealed with the seal material 13 can be simplified and a sealing area can be reduced, it is possible to obtain a merit of enhancing the sealability as well as an effect of reducing a machine difference due to simple construction. Further, a decrease in exhaust volume can lead to minimization of exhaust facilities, and a facility cost and a running cost can be reduced.

Further, the air pressure in the latch driving mechanism storage section 9 may be reduced to be lower than the air pressure in the clean room 30 by such a configuration as shown in FIG. 12. That is, as shown in FIG. 12, the load port 1 may include a hollow shaft section 17 which supports the latch driving mechanism storage section 9 so that the air pressure in the latch driving mechanism storage section 9 can be reduced to be lower than the air pressure in the clean room 30 when the exhaust device 11 connected to the shaft section 17 reduces a pressure in the shaft section 17. At this time, an inner space of the shaft section 17 is connected to an inner space of the latch driving mechanism storage section 9, and the inside of the shaft section 17 and the inside of the latch driving mechanism storage section 9 are made airtight by the seal material 13 and sealed to the wafer carrying chamber 51.

When the structure of the latch driving mechanism 8 is complicated and the inner cap 16 shown in FIG. 11 cannot be disposed, an airtight space can be extended to the shaft section 17 which supports the latch driving mechanism storage section 9 as shown in FIG. 12. The shaft section 17 can support the latch driving mechanism storage section 9 from below and is integrated with the door section 5 holding the lid 62 of the wafer storage container 61 and the latch driving mechanism storage section 9 to be movable in up-and-down and front-and-back directions, and the inside of this structure forms a path for wiring lines, pipings, and the like. For example, in the structure shown in FIGS. 1 and 3, an exhaust piping (a vacuum line 12) must be inserted into an inlet of the latch driving mechanism storage section 9, the inlet is narrow depending on each device, and hence inserting a thick piping is difficult in some cases. On the other hand, as shown in FIG. 12, when the exhaust piping is inserted into the shaft section 17, the exhaust piping can be thickened, and hence a sufficient exhaust volume can be assured. Furthermore, since a part which uses a large amount of the seal material 13 (a lower part of the shaft section 17) is kept away from the wafers W, contamination from the seal material 13 can be suppressed.

Moreover, the load port 1 according to the present invention may include both the inner cap 16 and the shaft section 17 described above.

A configuration which sets the air pressure in the latch driving mechanism storage section 9 to be equal to the air pressure in the clean room 30 will now be more specifically described. In this case, as shown in FIG. 4, when the latch driving mechanism storage section 9 is made airtight by the seal material 13 and sealed to the wafer carrying chamber 51, the air pressure in the latch driving mechanism storage section 9 can be set to be equal to the air pressure in the clean room 30. Additionally, like the above example, since the latch driving mechanism storage section 9 can be sealed to the wafer carrying chamber 51, the inflow of the air from the wafer carrying chamber 51 does not occur, an air current in a direction toward the wafer storage container 61 can be prevented from being produced, and adhesion of particles to the wafers can be further reduced.

A description will now be given as to a method for carrying wafers according to the present invention when such a load port 1 as described above is used. First, the method for carrying wafers according to the present invention is a method for carrying wafers by which the wafers W are taken in and out between the wafer carrying chamber 51 and the wafer storage container 61 by using the load port 1 according to the present invention provided to be adjacent to the wafer carrying chamber 51 installed in the clean room 30. Further, at the time of taking in and out the wafers W, the air pressure in the latch driving mechanism storage section 9 of the load port 1 according to the present invention is set to be equal to the air pressure in the clean room 30 or lower than the air pressure in the clean room 30. More specifically, the wafers can be taken in and out as follows.

First, the wafer storage container 61 having the wafers W stored therein is mounted on the mounting table 4 of the load port 1. At this time, the wafer storage container 61 is mounted in such a manner that the lid 62 of the wafer storage container 61 faces the opening 3 of the load port 1.

Then, the lid 62 of the wafer storage container 61 mounted on the mounting table 4 is sucked and held by the sucking tools 15.

Subsequently, in a state where the lid 62 is sucked and held by the sucking tools 15, when the container main body 63 and the lid 62 are unfixed from each other by the latches 7 and the container main body 63 is relatively moved to the sucking tools 15, the lid 62 is opened, and the door section 5 is detached from the opening 3 to open the opening 3. Consequently, the inner space of the wafer carrying chamber 51 is coupled with the inner space of the wafer storage container 61. In case of FIG. 1, when the lid is unfixed by the latches 7 and the door section 5 is moved down in a state where the lid 62 is sucked and held by the sucking tools 15, the door section 5 can be detached from the opening 3 and, at the same time, the lid 62 of the wafer storage container 61 can be opened. Further, as the mounting table 4, it is possible to use one which can move in a direction to get away from the opening 3 while having the wafer storage container 61 mounted thereon as described above. In this case, the lid is unfixed by the latches 7, the lid 62 is sucked and held by the sucking tools 15, and then the mounting table 4 is moved away from the opening 3, whereby the lid 62 can be detached from the container main body 63. Furthermore, subsequently, the opening 3 is opened by moving down the door section 5 having the lid 62 sucked and held by the sucking tools 15, and the mounting table 4 is moved closer to the opening 3 to connect the container main body 63 with the opening 3, thereby coupling the inner space of the wafer carrying chamber 51 with the inner space of the wafer storage container 61.

Then, the wafers W are taken out from the wafer storage container 61 (the container main body 63) by the wafer carrier robot 52. The wafers W which have been taken out are carried to, e.g., a processing device (not shown) or carried to a wafer storage container on an unloading side or the like which is installed separately from that on a loading side. The load port according to the present invention can be also installed and used on the unloading side.

Moreover, the wafers W which have been through predetermined processing can be returned to the wafer storage container 61 (the container main body 63) by the wafer carrier robot 52. After returning the wafers, in case of FIG. 1, when the door section 5 coupled with the lid 62 is fitted to the opening 3, the lid 62 can be returned to the container main body 63. Additionally, in case of FIG. 1, when the door section 5 is moved up, the door section 5 can be returned to the opening 3. Then, the latches 7 and the lid 62 are uncoupled from each other. As described above, the wafers can be taken in and out.

Further, according to the method for carrying wafers of the present invention, it is preferable to set the air pressure in the wafer carrying chamber 51 to be higher than the air pressure in the clean room 30. Consequently, the inflow of the air into the wafer carrying chamber from the clean room can be suppressed, and the cleanliness of the wafer carrying chamber can be maintained.

EXAMPLES

The present invention will now be more specifically described hereinafter with reference to examples and a comparative example, but the present invention is not restricted to these examples.

Example 1

As each load port of such a transfer machine as shown in FIG. 5 which is installed in a clean room, such a load port of the present invention as shown in FIGS. 1 to 3 was used to carry wafers. The load port of the present invention used in this example had an air pressure in a latch driving mechanism storage section set to be lower than the air pressure in the clean room, and the latch driving mechanism storage section was made airtight by a seal material and sealed to a wafer carrying chamber (in FIG. 5, the inside of the transfer machine having a wafer carrier robot or the like installed therein). Furthermore, such a load port according to the present invention was arranged to each of ports 1 to 4 (P1 to P4 in FIG. 5) of such a transfer machine as shown in FIG. 5.

Comparative Example

Wafers were carried in the same manner as that in Example 1 except that each conventional load port such as shown in FIGS. 7 to 9 was arranged in a transfer machine. The conventional load port used in this example did not perform a reduction in pressure using an exhaust pump and sealing of a latch driving mechanism storage section using a seal material.

In both Example 1 and Comparative Example described above, before carrying the wafers, a differential pressure between the clean room and the latch driving mechanism storage section was measured, and an amount of dust in air around latches was measured.

[Measurement of Differential Pressure Between Clean Room and Latch Driving Mechanism Storage Section]

A differential pressure gauge (manufactured by Omron Corp.) whose minimum unit is 0.1 Pa was used to measure an air pressure in the latch driving mechanism storage section with reference to the air pressure in the clean room. First, a low-pressure-side tube of the differential pressure gauge was installed at a position which is 1 m above a floor in the clean room. Then, one of two latches was capped (the other one was not capped), a high-pressure-side tube of the differential pressure gauge was inserted into the cap, and a differential pressure was measured. Consequently, as shown in Table 1, in Example 1, in each of all the load ports, the air pressure in the latch driving mechanism storage section was lower than the air pressure in the clean room. On the other hand, in Comparative Example, in each of all the load ports, the air pressure in the latch driving mechanism storage section was higher than the air pressure in the clean room. Furthermore, the air pressure in the latch driving mechanism storage section was −2.4 Pa to the air pressure in the clean room on average in Example 1, and it was +0.1 Pa in Comparative Example.

TABLE 1

| Unit | Comparative Example | | Example 1 | | |
|---|---|---|---|---|---|
| | Amount of dust in air Quantity/Cf | Differential pressure Pa | Amount of dust in air Quantity/Cf | Differential pressure Pa | Exhaust flow volume Litter/min |
| Port 1 | 12,940 | +0.1 | 0 | −2.8 | 9 |
| Port 2 | 48,552 | +0.1 | 0 | −2.7 | 8 |
| Port 3 | 14,750 | +0.1 | 0 | −1.7 | 10 |
| Port 4 | 47,884 | +0.1 | 0 | −2.3 | 10 |
| Average | 31,032 | +0.1 | 0 | −2.4 | 9.25 |

[Measurement of Amount of Dust in Air Around Latches]

A suction tube of a particle measuring instrument (manufactured by Hitachi DECO) was set in the vicinity of a latch section (on a clean room side). Then, the latch section alone was continuously driven (a lid opening/closing operation of the latches) by a manual operation, and particles (dust) in air were measured. At this time, the quantity of particles whose size is 0.07 μm or more was checked. Table 1 shows a measurement result.

A measured quantity of dust in the air was 0/Cf (0/cubic foot) on average in Example 1, and it was 31,032/Cf in Comparative Example. It is to be noted that the unit of cubic foot can be easily converted into a unit based on the metric system measurement, and one cubic foot corresponds to approximately 28.3 litters. In Example 1 where an air pressure in the latch driving mechanism storage section is lower than the air pressure in the clean room, the dust produced in the latch driving mechanism storage section hardly flowed to the clean room side through the periphery of the latches, and the measured amount of dust in the air was very small. On the other hand, in Comparative Example, since the air pressure in the latch driving mechanism storage section is higher than the air pressure in the clean room, the measured amount of dust in the air was considerably increased.

[Measurement of Quantity of Particles Adhering to Wafers During Carriage]

First, two FOUP each containing three polished wafers (PW) each having a diameter of 300 mm were prepared. Further, LLS (Localized Light Scatters) measurement was performed to all the wafers. Here, the quantity of particles whose size is 28 nm or more was checked. Further, as particle measuring instruments, Surfscan SP2, Surfscan SP3, and Surfscan SP5 manufactured by KLA-Tencor Corporation were used.

Then, as shown in FIG. 5, the FOUPs having the wafers stored therein were set in load ports (P1 and P2 in FIG. 5) on a loader side, empty FOUPs were set in load ports (P3 and P4 in FIG. 5) on an unloader side, and the wafers were carried between these FOUPs in a reciprocatory manner. This operation was performed in all the two ports on the supply side.

Subsequently, all the wafers which have been through the carriage were subjected to the LLS measurement under the same conditions as those described above, and the quantity of particles whose size is 28 nm or more was checked. Furthermore, an increased quantity of LLS (an increased quantity of particles) was calculated in each wafer before and after the carriage, and an increased quantity of LLS per carriage was calculated.

FIG. 6 is a graph showing the increased quantity of LLS of each wafer per carriage in accordance with each particle size. When the air pressure in the latch driving mechanism storage section is lower than the air pressure in the clean room like Example 1, the quantity of particles whose size is 28 nm or more was 0.09 (quantity/wafer), and hence the increased quantity of particles was considerably smaller than that in Comparative Example (0.85/wafer) where the air pressure in the latch driving mechanism storage section is higher than the air pressure in the clean room.

Example 2

Wafers were carried like Example 1 except that the load ports according to the present invention each having such a latch driving mechanism storage section as shown in FIG. 4 were arranged in a transfer machine. That is, in each load port according to the present invention used in this example, a latch driving mechanism storage section was made airtight by a seal material, and the latch driving mechanism storage section was sealed to a wafer carrying chamber (inside the transfer machine).

Then, the same method as those of Example 1 and Comparative Example was used to measure a differential pressure between a clean room and the latch driving mechanisms storage section and also measure an amount of dust in air around latches before carrying the wafers. Table 2 shows its result. Further, for comparison, Table 2 also shows the measurement result of Comparative Example.

TABLE 2

| Unit | Comparative Example | | Example 2 | |
|---|---|---|---|---|
| | Amount of dust in air Quantity/Cf | differential pressure Pa | amount of dust in air Quantity/Cf | differential pressure Pa |
| Port 1 | 12,940 | +0.1 | 0 | 0.0 |
| Port 2 | 48,552 | +0.1 | 2 | 0.0 |
| Port 3 | 14,750 | +0.1 | 1 | 0.0 |
| Port 4 | 47,884 | +0.1 | 0 | 0.0 |
| Average | 31,032 | +0.1 | 0.8 | 0.0 |

As shown in Table 2, in Example 2, a measured quantity of dust in air was 0.8/Cf on average. In Example 2 where an air pressure in the latch driving mechanism storage section is equal to the air pressure in the clean room, the dust generated in the latch driving mechanism storage section hardly flowed to the clean room side through the periphery of the latches, and the measured quantity of dust in air was very smaller than that in Comparative Example.

Then, an amount of particles adhering to each wafer during carriage was measured by the same technique as those in Example 1 and Comparative Example. FIG. 10 shows its result. It is to be noted that, for comparison, a measurement result of the particle amount in Comparative Example is also shown in addition to a measurement result of the particle amount in Example 2.

When the air pressure in the latch driving mechanism storage section is equal to the air pressure in the clean room like Example 2, the quantity of particles whose size is 28 nm or more was 0.18 (quantity/wafer), and an increased quantity of particles was smaller than that in Comparative Example (0.85/wafer).

Example 3

Wafers were carried in the same manner as that in Example 1 except that such load ports according to the present invention as shown in FIG. 11 each of which has an inner cap connected with an exhaust device in a latch driving mechanism storage section were arranged in a transfer machine. That is, in each load port according to the present invention used in this example, the inside of the inner cap is made airtight by a seal member, and air in the inner cap is exhausted, thereby reducing an air pressure in the inner cap to be lower than the air pressure in a clean room.

In Example 3, the same methods as those in Examples 1 and 2 and Comparative Example was used to measure a differential pressure between the clean room and the inner cap and also measure an amount of dust in air around latches before carrying the wafers. Furthermore, an amount of particles adhering to each wafer during carriage was measured by the same technique as those in Examples 1 and 2 and Comparative Example.

Example 4

Wafers were carried in the same manner as that in Example 1 except that such load ports as shown in FIG. 12 each of which can reduce an air pressure in a latch driving mechanism storage section to be lower than the air pressure in a clean room by decreasing a pressure in a shaft section were arranged in a transfer machine.

In Example 4, the same method as those in Examples 1 to 3 and Comparative Example was used to measure a differential pressure between the clean room and the latch driving mechanism storage section and also measure an amount of dust in air around latches before carrying the wafers. Moreover, an amount of particles adhering to each wafer during carriage was measured by the same technique as those in Examples 1 to 3 and Comparative Example.

Table 3 collectively shows the differential pressures and the amounts of dust in air around latches measured in Examples 3 and 4. Additionally, for comparison, Table 3 also shows the measurement results of Comparative Example. Further, Table 4 shows a measurement result of an amount of particles adhering to each wafer during carriage. It is to be noted that, for comparison, Table 4 also shows the measurement result of the amount of particles in Comparative Example.

TABLE 3

| Unit | Comparative Example | | Example 3 (Inner cap) | | | Example 4 (Pressure Reduction including shaft section) | | |
|---|---|---|---|---|---|---|---|---|
| | Amount of dust in air Quantity/Cf | Differential pressure Pa | Amount of dust in air Quantity/Cf | Differential pressure Pa | Exhaust flow volume Litter/min | Amount of dust in air Quantity/Cf | Differential pressure Pa | Exhaust flow volume Litter/min |
| Port 1 | 12,940 | 0.1 | 0 | −3.1 | 2 | 0 | −2.8 | 15 |
| Port 2 | 48,552 | 0.1 | 0 | −3 | 3 | 1 | −2.9 | 18 |
| Port 3 | 14,750 | 0.1 | 0 | −3.2 | 1 | 0 | −3 | 17 |
| Port 4 | 47,884 | 0.1 | 0 | −2.9 | 2 | 0 | −2.9 | 16 |
| Average | 31,032 | 0.1 | 0 | −3.1 | 2 | 0.25 | −2.9 | 16.5 |

TABLE 4

| | 28 nm or more | 32 nm or more | 37 nm or more | 45 nm or more | 65 nm or more | 85 nm or more | 120 nm or more | 160 nm or more |
|---|---|---|---|---|---|---|---|---|
| Comparative Example | 0.85 | 0.70 | 0.51 | 0.40 | 0.19 | 0.08 | 0.01 | 0.01 |
| Example 3 | 0.08 | 0.07 | 0.06 | 0.06 | 0.05 | 0.05 | 0.02 | 0.01 |
| Example 4 | 0.08 | 0.08 | 0.07 | 0.07 | 0.05 | 0.05 | 0.02 | 0.02 |

As shown in Table 3, in Examples 3 and 4, the measured quantities of dust in air were 0/Cf or 0.25/Cf on average, respectively, and each measured quantity of dust in air was very smaller than that in Comparative Example. Furthermore, in Example 3, the exhaust flow volume can be set to be smaller than that of Example 1 and, on the other hand, the exhaust flow volume can be set to be larger in Example 4.

Moreover, as shown in Table 4, in each of Examples 3 and 4, the quantity of particles whose size is 28 nm or more was 0.08 (quantity/wafer), and the increased quantity of particles was smaller than 0.85 (quantity/wafer) in Comparative Example.

It is to be noted that the present invention is not restricted to the foregoing examples. The foregoing examples are illustrative examples, and any example which has substantially the same structure and exerts the same functions and effects as the technical concept described in claims of the present invention is included in the technical scope of the present invention.

The invention claimed is:

1. A load port which is provided to be adjacent to a wafer carrying chamber installed in a clean room and configured to take in and out wafers between the wafer carrying chamber and a wafer storage container comprising a container main body and a lid, the load port comprising:

a tabular portion which constitutes a part of a wall surface of the wafer carrying chamber and comprises an opening through which the wafer carrying chamber is opened;

a mounting table on which the wafer storage container is mounted in such a manner that the lid of the wafer storage container faces the opening;

a door section which is fitted in the opening, and drivable in such a manner that the door section is detached from the opening to enable opening and closing of the opening;

a sucking tool which is installed in the door section, and capable of holding the lid by sucking the lid;

a latch which is installed in the door section, drivable to unfix the container main body and the lid, and drivable to fix the container main body and the lid;

a latch driving mechanism storage section which is provided to be adjacent to the door section in the wafer carrying chamber, and stores a latch driving mechanism to drive the latch therein, an air pressure in the latch driving mechanism storage section being settable to be equal to an air pressure in the clean room or lower than the air pressure in the clean room; and at least one of (i) an inner cap which stores the latch driving mechanism therein in the latch driving mechanism storage section, the inner cap being connected to an exhaust device, and the exhaust device enabling reduction of an air pressure in the inner cap to be lower than the air pressure in the clean room, and (ii) a hollow shaft section which supports the latch driving mechanism storage section, an inner space of the shaft section being connected to an inner space of the latch driving mechanism storage section, and an inside of the shaft section and an inside of the latch driving mechanism storage section being made airtight by the seal material and sealed to the wafer carrying chamber, and the exhaust device being connected to the shaft section enabling reduction of the air pressure in the latch driving mechanism to be lower than the air pressure in the clean room by decreasing an air pressure in the shaft section, wherein opening/closing the lid is enabled by unfixing the container main body and the lid by the latch and relatively moving the container main body to the sucking tool in a state where the lid is sucked and held by the sucking tool.

2. The load port according to claim 1, wherein the latch driving mechanism storage section is connected to the exhaust device, and the exhaust device enables reducing the air pressure in the latch driving mechanism storage section to be lower than the air pressure in the clean room.

3. The load port according to claim 1, wherein the latch driving mechanism storage section is made airtight by a seal material and sealed to the wafer carrying chamber.

4. The load port according to claim 2, wherein the latch driving mechanism storage section is made airtight by a seal material and sealed to the wafer carrying chamber.

5. A method for carrying wafers by which wafers are taken in and out between a wafer carrying chamber and a wafer storage container with the use of the load port according to claim 1 which is provided to be adjacent to the wafer carrying chamber installed in a clean room, the method comprising:

setting an air pressure in the latch driving mechanism storage section to be equal to the air pressure in the clean room or lower than the air pressure in the clean room; and unfixing the container main body and the lid by the latch and relatively moving the container main body to the sucking tool in a state where the lid is sucked and held by the sucking tool to open the lid, coupling an inner space of the wafer carrying chamber with an inner space of the wafer storage container by detaching the door section from the opening to open the opening, and then taking in and out the wafers between the wafer carrying chamber and the wafer storage container.

6. The method for carrying wafers according to claim 5, wherein the air pressure in the wafer carrying chamber is set to be higher than the air pressure in the clean room.

* * * * *